(12) United States Patent     (10) Patent No.: US 12,588,179 B2

Sharma et al.     (45) Date of Patent: Mar. 24, 2026

(54) FLY BITLINE DESIGN FOR PSEUDO TRIPLE PORT MEMORY

(71) Applicant: QUALCOMM Incorporated, San Diego, CA (US)

(72) Inventors: Sunil Sharma, Bangalore (IN); Arun Babu Pallerla, San Diego, CA (US); Sung Son, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 398 days.

(21) Appl. No.: 18/318,599

(22) Filed: May 16, 2023

(65) Prior Publication Data

US 2024/0389292 A1    Nov. 21, 2024

(51) Int. Cl.
*H10B 10/00*     (2023.01)

(52) U.S. Cl.
CPC ................................... *H10B 10/12* (2023.02)

(58) Field of Classification Search
CPC .......... H10B 10/12; H10D 89/10; G11C 8/16; G11C 11/412
See application file for complete search history.

(56) References Cited

U.S. PATENT DOCUMENTS 6,980,462 B1   12/2005   Ramesh et al.
9,524,972 B2 *   12/2016   Mojumder ............... G11C 8/16

9,672,903 B2 *   6/2017   Liaw ................... B81C 1/00253
10,685,951 B1 *   6/2020   Gupta .................. H10N 70/011
11,404,113 B2 *   8/2022   Nien ...................... H10D 89/10
2006/0064664 A1   3/2006   Faber et al.
2022/0068360 A1   3/2022   Pallerla et al.

OTHER PUBLICATIONS

International Search Report and Written Opinion—PCT/US2024/025006—ISA/EPO—Aug. 21, 2024.

* cited by examiner

*Primary Examiner* — Allison Bernstein

(74) *Attorney, Agent, or Firm* — Qualcomm Incorporated/Seyfarth Shaw LLP

(57)      ABSTRACT

A memory includes a bitcell on a substrate, having a bitcell width and a bitcell height and a first access transistor and a second access transistor. The memory includes a first metal layer patterned to form a first pair of wordlines, including a first wordline coupled to a gate of the first access transistor and a second wordline coupled to a gate of the second access transistor. The memory includes a second metal layer patterned to form a pair of second metal layer islands. The pair of second metal layer islands include a first island coupled to the first wordline and a second island coupled to the second wordline. The memory includes a third metal layer patterned to form a pair of third metal layer interconnects, including a first interconnect coupled to the first island and a second interconnect coupled to the second island.

18 Claims, 17 Drawing Sheets

Regular PTP (N4)
192x128, mux2, 4 banks, 24cpbl (28.4um x 78.2um)

100

102 — CPU

104 — GPU

106 — DSP

108 — NPU

110 — CONNECTIVITY

112 — MULTIMEDIA

114 — SENSORS

116 — ISPs

118 — MEMORY

120 — NAVIGATION

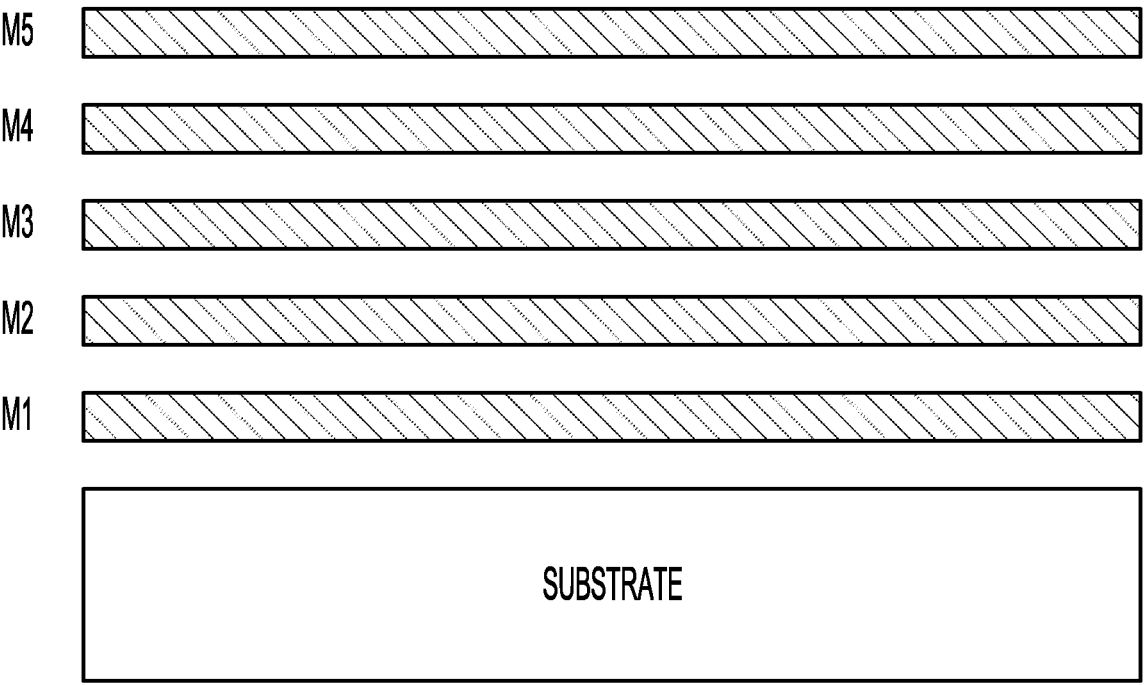
FIG. 5

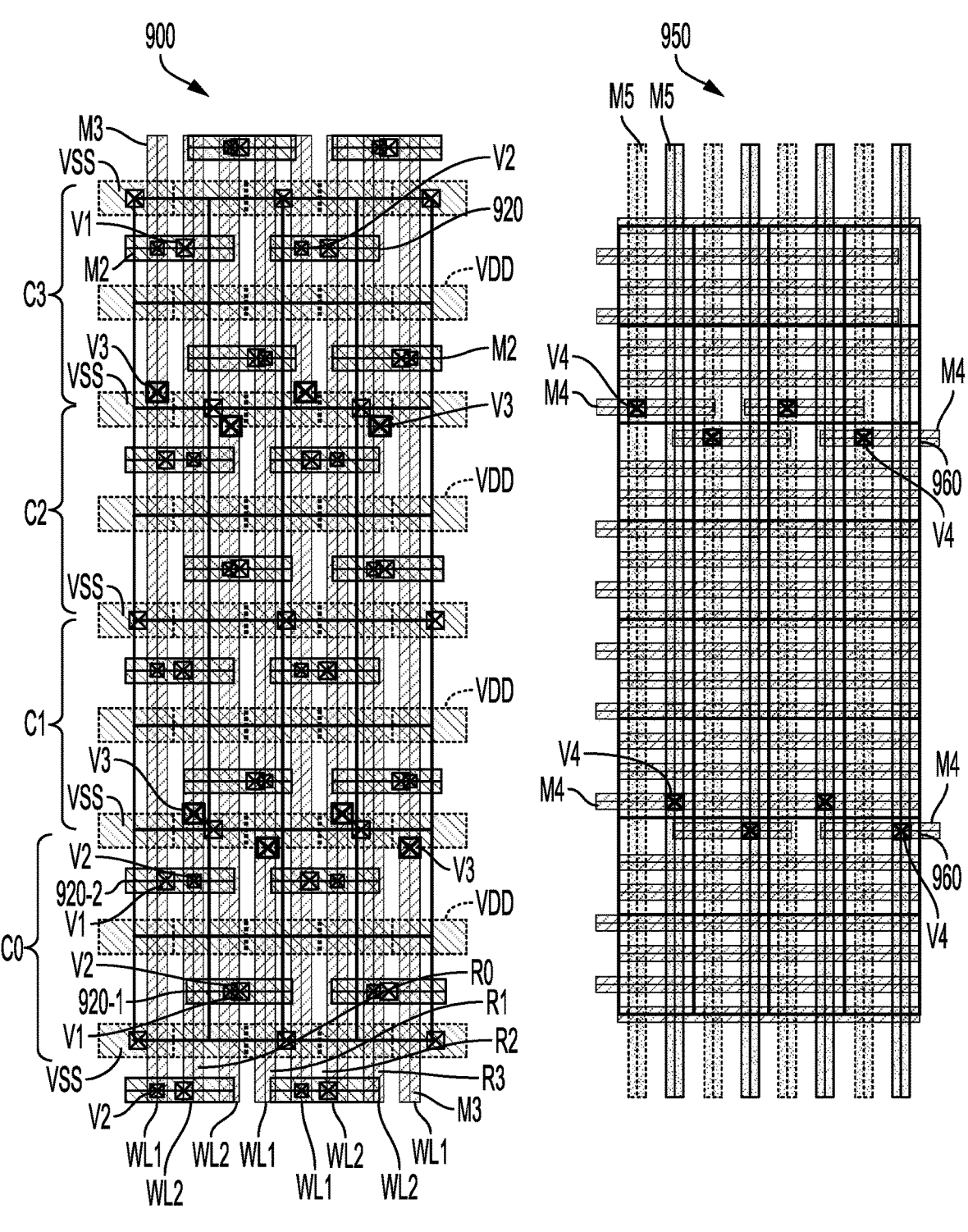
FIG. 9A　　　　　　FIG. 9B

BL_L<7>
BLB_L<7>
BLB_L<6>
BL_L<6>
BL_L<5>
BLB_L<5>
BLB_L<4>
BL_L<4>
BL_L<3>
BLB_L<3>
BLB_L<2>
BL_L<2>
BL_L<1>
BLB_L<1>
1150
SEE FIG. 11A
TrkBL_L

B3

405

B2

SEE FIG.11B

1110

1100

1200

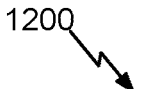

1202

FORM A BITCELL ON THE SEMICONDUCTOR SUBSTRATE, THE BITCELL HAVING A BITCELL WIDTH AND A BITCELL HEIGHT AND INCLUDING A FIRST ACCESS TRANSISTOR AND A SECOND ACCESS TRANSISTOR

1204

PATTERN A FIRST METAL LAYER ADJACENT THE SUBSTRATE TO FORM A FIRST PAIR OF WORDLINES ARRANGED WITHIN THE BITCELL HEIGHT, THE FIRST PAIR OF WORDLINES INCLUDING A FIRST WORDLINE COUPLED TO A GATE OF THE FIRST ACCESS TRANSISTOR AND INCLUDING A SECOND WORDLINE COUPLED TO A GATE OF THE SECOND ACCESS TRANSISTOR

1206

PATTERN A SECOND METAL LAYER ADJACENT THE FIRST METAL LAYER TO FORM A PAIR OF SECOND METAL LAYER ISLANDS WITHIN THE BITCELL WIDTH, THE PAIR OF SECOND METAL LAYER ISLANDS INCLUDING A FIRST ISLAND COUPLED TO THE FIRST WORDLINE AND A SECOND ISLAND COUPLED TO THE SECOND WORDLINE

1208

PATTERN A THIRD METAL LAYER ADJACENT THE SECOND METAL LAYER TO FORM A PAIR OF THIRD METAL LAYER INTERCONNECTS, INCLUDING A FIRST INTERCONNECT COUPLED TO THE FIRST ISLAND AND A SECOND INTERCONNECT COUPLED TO THE SECOND ISLAND

*FIG. 12*

FLY BITLINE DESIGN FOR PSEUDO TRIPLE PORT MEMORY

BACKGROUND

Field

Aspects of the present disclosure relate to semiconductor devices and, more particularly, to a fly bitline design for pseudo triple port memory.

Background

Semiconductor memory devices include, for example, a static random-access memory (SRAM) and a dynamic random-access memory (DRAM). A DRAM memory cell includes one transistor and one capacitor, thereby providing a high degree of integration. DRAM, however, requires constant refreshing, which limits the use of DRAM to computer main memory. An SRAM memory cell, by contrast, is bi-stable, meaning that it can maintain its state statically and indefinitely, so long as adequate power is supplied. SRAM also supports high speed operation, with lower power dissipation, which is useful for computer cache memory.

To continue SRAM scaling, SRAM bitcell layouts should be designed to allow higher density, higher yield, and lower production costs. One example of an SRAM memory cell is a six transistor (6T) SRAM memory cell that includes, for example, six metal-oxide-semiconductor (MOS) transistors, which may be used to provide, for example, dual-port SRAM. In a dual-port SRAM, each column has two pairs of bitlines. Although dual-port SRAMs enable simultaneous read/write operations, extra access transistors for bitcells of the dual-port SRAM produce a lower density (e.g, the number of bitcells that may be implemented in a given area of die space).

Accordingly, there is a need in the art for multi-port memories having increased density.

SUMMARY

A memory includes a bitcell on a substrate, having a bitcell width and a bitcell height and a first access transistor and a second access transistor. The memory includes a first metal layer patterned to form a first pair of wordlines, including a first wordline coupled to a gate of the first access transistor and a second wordline coupled to a gate of the second access transistor. The memory includes a second metal layer patterned to form a pair of second metal layer islands. The pair of second metal layer islands include a first island coupled to the first wordline and a second island coupled to the second wordline. The memory includes a third metal layer patterned to form a pair of third metal layer interconnects, including a first interconnect coupled to the first island and a second interconnect coupled to the second island.

A method for memory fabrication is described. The method includes forming a bitcell on a semiconductor substrate. The bitcell has a bitcell width and a bitcell height and includes a first access transistor and a second access transistor. The method also includes patterning a first metal layer adjacent the semiconductor substrate to form a first pair of wordlines arranged within the bitcell height. The first pair of wordlines include a first wordline coupled to a gate of the first access transistor and a second wordline coupled to a gate of the second access transistor. The method further includes patterning a second metal layer adjacent the first metal layer to form a pair of second metal layer islands within the bitcell width. The pair of second metal layer islands include a first island coupled to the first wordline and a second island coupled to the second wordline. The method also includes patterning a third metal layer adjacent the second metal layer to form a pair of third metal layer interconnects, including a first interconnect coupled to the first island and a second interconnect coupled to the second island.

This has outlined, broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for conducting the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 5 illustrates a cross-section of a semiconductor device and metal layers for a split wordline implementation, in accordance with various aspects of the present disclosure.

FIGS. 9A and 9B are schematic diagrams illustrating top views of back-end-of-line (BEOL) metal layers to implement the strapped wordline connection of the PTPHC bitcell array of FIG. 8, according to various aspects of the present disclosure.

FIGS. 11A, 11A-1, 111B, and 11C illustrate a metal layer patterning to form the global read port bitlines for a column in a MUX1 array in accordance with an aspect of the disclosure.

FIG. 12 is a process flow diagram illustrating a method for fabricating a fly bitline design, according to various aspects of the present disclosure.

DETAILED DESCRIPTION

Figure 1:
FIG. 1 illustrates an example implementation of a system-on-chip (SoC), which includes a pseudo-triple-port (PTP) memory bitcell having a fly bitline design, in accordance with various aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Semiconductor memory devices include, for example, a static random-access memory (SRAM) and a dynamic random-access memory (DRAM). A DRAM memory cell includes one transistor and one capacitor, thereby providing a high degree of integration. DRAM, however, requires constant refreshing, which limits the use of DRAM to computer main memory. An SRAM memory cell, by contrast, is bi-stable, meaning that it can maintain its state statically and indefinitely, so long as adequate power is supplied. SRAM also supports high speed operation, with lower power dissipation, which is useful for computer cache memory.

In a conventional SRAM, a bitcell connects to a pair of bitlines through a corresponding pair of access transistors during a read operation. To switch on the access transistors during a read operation, a wordline controller asserts the voltage of a wordline that connects to a gate of each of the access transistors. The wordline controller also asserts the wordline to switch on the access transistors during a write operation. The pair of access transistors and corresponding bitlines may thus be treated as a single read port and a single write port to the bitcells. The pair of bitlines are shared by other bitcells and their corresponding access transistors. The resulting group of bitcells linked by their common bitline pair is typically denoted as a column of bitcells. Because there is just one bitline pair for the column, only a single read operation or a single write operation can occur each time the wordline is asserted.

To accommodate applications such as video processing that require simultaneous multiple read or write operations to the same column, dual-port SRAMs have been developed. In a dual-port SRAM, each column has two pairs of bitlines. Each bitcell may thus have one pair of access transistors for coupling to one of the bitline pairs and have another pair of access transistors for coupling to another one of the bitline pairs. Although such dual-port SRAMs enable simultaneous read/write operations, the extra access transistors for each bitcell produce a lower density (the number of bitcells that may be implemented in a given area of die space).

Accordingly, various aspects of the present disclosure are directed to multi-port memories having increased density by relying on a system hierarchy that provides for interconnection of active devices at a lowest system level all the way up to system level interconnections at a highest level. These interconnections rely on semiconductor fabrication processes that are often divided into three parts: a front-end-of-line (FEOL), a middle-of-line (MOL) and a back-end-of-line (BEOL). Front-end-of-line processes include wafer preparation, isolation, well formation, gate patterning, spacers, and dopant implantation. A middle-of-line process includes gate and terminal contact formation. Back-end-of-line processes include forming interconnects and dielectric layers for coupling to the FEOL devices.

The BEOL interconnect layers, which may refer to the conductive interconnect layers (e.g., a first BEOL interconnect layer or metal one (M1), metal two (M2), metal three (M3), metal four (M4), etc.) for electrically coupling to front-end-of-line active devices of an integrated circuit. The various back-end-of-line interconnect layers are formed at corresponding back-end-of-line interconnect levels, in which lower back-end-of-line interconnect levels use thinner metal layers relative to upper back-end-of-line interconnect levels. The back-end-of-line interconnect layers may electrically couple to middle-of-line (MOL) interconnect layers, for example, a zero interconnect (M0) to provide a connection between the M1 interconnect layer and an oxide diffusion (OD) layer of an integrated circuit.

Various aspects of the disclosure provide a layout structure for a pseudo-triple-port (PTP) memory bitcell having a fly bitline design. A process flow for fabrication of the layout structure for PTP memory bitcell having the fly bitline design may involve modifications in metallization layer connections during the BEOL process. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms "chip" and "die" may be used interchangeably.

According to aspects of the present disclosure, an area reduction of a multi-bank pseudo-triple-port (PTP) memory is improved by fabricating PTP bitcells using a fly bitline design. In various aspects of the present disclosure, a memory includes a semiconductor substrate having a bitcell arranged on the semiconductor substrate. The bitcell has a bitcell width and a bitcell height and includes a first access transistor and a second access transistor. The memory also includes a first metal layer adjacent the substrate. In some aspects of the present disclosure, the first metal layer is patterned to form a first pair of wordlines arranged within the bitcell height. The pair of wordlines may include a first read port wordline coupled to a gate of the first access transistor and a second read port wordline coupled to a gate of the second access transistor. The memory further includes a second metal layer adjacent the first metal layer.

In various aspects of the present disclosure, the second metal layer is patterned to form a pair of second metal layer islands arranged within the bitcell width. The pair of second metallization layer islands may include a first island coupled to the first read port wordline and a second island coupled to the second read port wordline. The memory also includes a third metal layer adjacent the second metal layer. In some aspects of the present disclosure, the third metal layer is patterned to form a pair of third metal interconnects. The third metal interconnects may include a first interconnect coupled to the first island and a second interconnect coupled to the second island.

FIG. 1 illustrates an example implementation of a host system-on-chip (SoC) 100, which includes a pseudo-triple-port (PTP) memory bitcell having a fly bitline design, in accordance with aspects of the present disclosure. The host SoC 100 includes processing blocks tailored to specific functions, such as a connectivity block 110. The connectivity block 110 may include sixth generation (6G), connectivity fifth generation (5G) new radio (NR) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multimedia engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

To solve the density problems of dual-port memories, a memory (e.g., static random-access memory (SRAM)) bitcell is provided with a pair of two independent wordlines. A first wordline in the pair drives the gate of a first access transistor for the bitcell. Similarly, a second wordline in the pair of wordlines drives the gate of a second access transistor for the bitcell. The first access transistor is coupled between a true output node for the bitcell and a bitline. Similarly, the second access transistor is coupled between a complement output node for the bitcell and a complement bitline. A read operation for the bitcell is single ended because the operation involves just one of the bitlines and a corresponding one of the wordlines.

Figure 2:
FIG. 2 is a schematic diagram illustrating a column of pseudo-triple-port memory bitcells, in accordance with various aspects of the present disclosure.

FIG. 2 is a schematic diagram illustrating a column of pseudo-triple-port memory bitcells in accordance with aspects of the present disclosure. As shown in FIG. 2, a set of the bitcells are arranged into a column of bitcells, including a shared bitline and a complement bitline. Each bitcell has its own first access transistor and second transistor controlled by a corresponding pair of wordlines in an example column 200 and wordline decoder 250, which are shown in FIG. 2. In this example, the column 200 includes a first bitcell 205 and a second bitcell 210, but it will be appreciated that column 200 may include additional bitcells that are not shown for illustration clarity. Each bitcell is within its own row of other bitcells (not illustrated) that share a corresponding pair of wordlines. For example, the first bitcell 205 is arranged in a zeroth row of bitcells. Similarly, the second bitcell 210 is in a first row of bitcells.

A read port of a wordline WL0 extends across the zeroth row and drives a first n-type metal-oxide semiconductor (NMOS) access transistor M1 in the first bitcell 205. A read port of the wordline WL0 similarly drives other first access transistors in the remaining bitcells (not illustrated) in the zeroth row. A read port of a wordline WLB0 also extends across the zeroth row and drives a second NMOS access transistor M2 in the first bitcell 205. The read port of the wordline WLB0 similarly drives other second access transistors (not illustrated) in the zeroth row. Because the wordlines are controlled independently during a read operation, the combination of the bitline BL, the wordline WL0, and the access transistor M1 form a read port for the first bitcell 205. The bitline BL may thus also be denoted as the read port bitline. Similarly, the combination of the complement bitline BLB, the wordline WLB0, and the access transistor M2 form a read port for the first bitcell 205. The complement bitline BLB may thus also be denoted as a read port bitline.

The wordline pair for the first row of bitcells is analogous. For example, a read port of a wordline WL1 in the wordline pair extends across the first row to drive access transistor M1 in the second bitcell 210. The read port of a wordline WL1 similarly drives other first access transistors in the remaining bitcells (not illustrated) in the first row. A read port of a wordline WLB1 extends across the first row to drive access transistor M2 in the second bitcell 210. The read port of the wordline WLB1 similarly drives other second access transistors (not illustrated) in the first row. The second bitcell 210 thus has a read port from a combination of its access transistor M1, the bitline BL, and the wordline WLA1. Similarly, the second bitcell 210 has a read port from a combination of its access transistor M2, the complement bitline BLB, and the wordline WLB1.

Suppose that a read port is accessed in the first bitcell 205 through an assertion of a voltage for the wordline WL0. Because the access transistor M1 is coupled between the true output node (H) of the first bitcell 205, the voltage of bitline BL is charged according to the binary contents of the first bitcell 205 when the voltage of the wordline WL0 is asserted. If the first bitcell 205 stores a binary one in a binary-high convention, the output node H of the first bitcell 205 is charged to the power supply voltage. Prior to the read operation, the bitline BL is charged to the power supply voltage. During the read operation, the bitline BL remains charged by the power supply voltage when the first bitcell 205 stores a binary one. If the first bitcell 205 stores a binary zero, the read operation causes the bitline BL to discharge towards ground while the access transistor M1 is switched on. During a read operation to column 200, two different bitcells may be read simultaneously.

It will be appreciated that column 200 is shown in simplified form in that bitline BL drives a global bitline (global read bitline) that is not shown for illustration clarity in FIG. 2. Similarly, complement bitline BLB drives a global read bitline (global read bitline B) that is also not shown in FIG. 2. It is the global read bitlines that drive the inverter sense amplifiers. For example, an inverter 215 inverts a voltage of the global read bitline A to drive a latch 225 that latches a bit decision for the read-port-A-accessed bitcell such as the first bitcell 205. In this case, because the read operation is to read port A, the resulting data output signal (bit decision) from latch 225 may be designated as DOUTA. A buffer 235 may buffer the DOUTA signal in some implementations.

Similarly, an inverter 220 inverts a voltage of the global read bitline B to drive a latch 230 that latches a bit decision for the read-port-B-accessed bitcell such as bitcell 210. Because the stored bit in the first bitcell 205 is being inverted by the inverter 215, the latch 225 inverts the output of inverter 215 to provide the DOUTA signal. Conversely, because the read port B is driving the complement bitline BLB that is inverted by inverter 220, the latch 230 is arranged to not invert the output of inverter 220. In this way, the output of the latch 230 equals the bit value (true or false) of the read-port-B-accessed bitcell such as the second bitcell 210. As described, the term "latch" refers to a storage cell for storing a bit. The resulting data output signal from read port B may be designated as DOUTB. A buffer 240 may buffer the DOUTB signal in some implementations.

As further illustrated in FIG. 2, each of the access transistor M2 connects between the complement output node (L) of its bitcell and the complement bitline BLB. When the second bitcell 210 stores a binary zero, the read access through read port B causes the bitline BLB to remain charged to the power supply voltage. Conversely, when the second bitcell 210 stores a binary one, the read access through read port B causes the bitline BLB to discharge while the access transistor M2 conducts. A read access through read port B causes the complement bitline BLB to charge according to the complement of the binary value stored in the accessed bitcell. Note that the same bitcell may be simultaneously accessed through the read port A and the read port B in the same read cycle, although the bit decisions would of course be the same in that case.

The resulting dual read ports A and B for the bitcells in column 200 are "pseudo read ports" since each bitcell has only two access transistors and the single pair of bitlines. In contrast, a bitcell with traditional dual read ports would have a pair of bitlines and a pair of access transistors for each port. Read ports A and B advantageously increase density as each bitcell may be formed from six transistors: the pair of access transistors M1 and M2 and four transistors to form the cross-coupled inverters within the bitcells as is discussed below. The following discussion will also refer to pseudo-triple-port bitcells as simply "bitcells" for brevity.

The read operation (which may also be denoted herein as a read cycle) occurs during a first portion of a memory clock signal cycle. The write operation (which may also be denoted herein as a write cycle) may occur during a remaining second portion of the memory clock signal. The resulting read and write operation may thus be denoted as being "double pumped" in that both the read operation(s) and the write operation occur in one memory clock cycle.

FIG. 2 further illustrates a wordline decoder 250 for a pseudo-triple-port memory, according to aspects of the present disclosure. For each row of bitcells, there is a corresponding pair of wordlines formed by a read port A wordline and a read port B wordline. For example, the zeroth row of bitcells in column 200 may be accessed through an assertion of the read port A wordline WL0 (e.g., wl< >) or through an assertion of the read port B wordline WLB0 (e.g., wlb< >) during a read operation using the gates and the inverters of the wordline decoder 250. If just one read port is accessed, the read wordline voltage for the remaining read port is not asserted during the read operation. In contrast, both the wordlines in a wordline pair are asserted for an addressed row of bitcells during a write operation. The wordline decoder 250 may accommodate selective activation of just one wordline in a wordline pair during a read operation and the activation of both the wordlines in a wordline pair during a write operation, based on a 256-row implementation.

Referring again to column 200, although the write operation is differential to a pseudo-triple-port SRAM, the read operation is single-ended. As the number of rows is increased, the capacitance of the bitlines in a column will increase. With this increased capacitance, it will take longer and longer for an accessed bitcell to charge (or discharge) an accessed bitline to trigger a simple single-ended sense amplifier such as inverters 215 and 220 to make a bit decision for the read operation. It is this advantageous to divide an array of pseudo-triple-port bitcells into banks.

Figure 3:
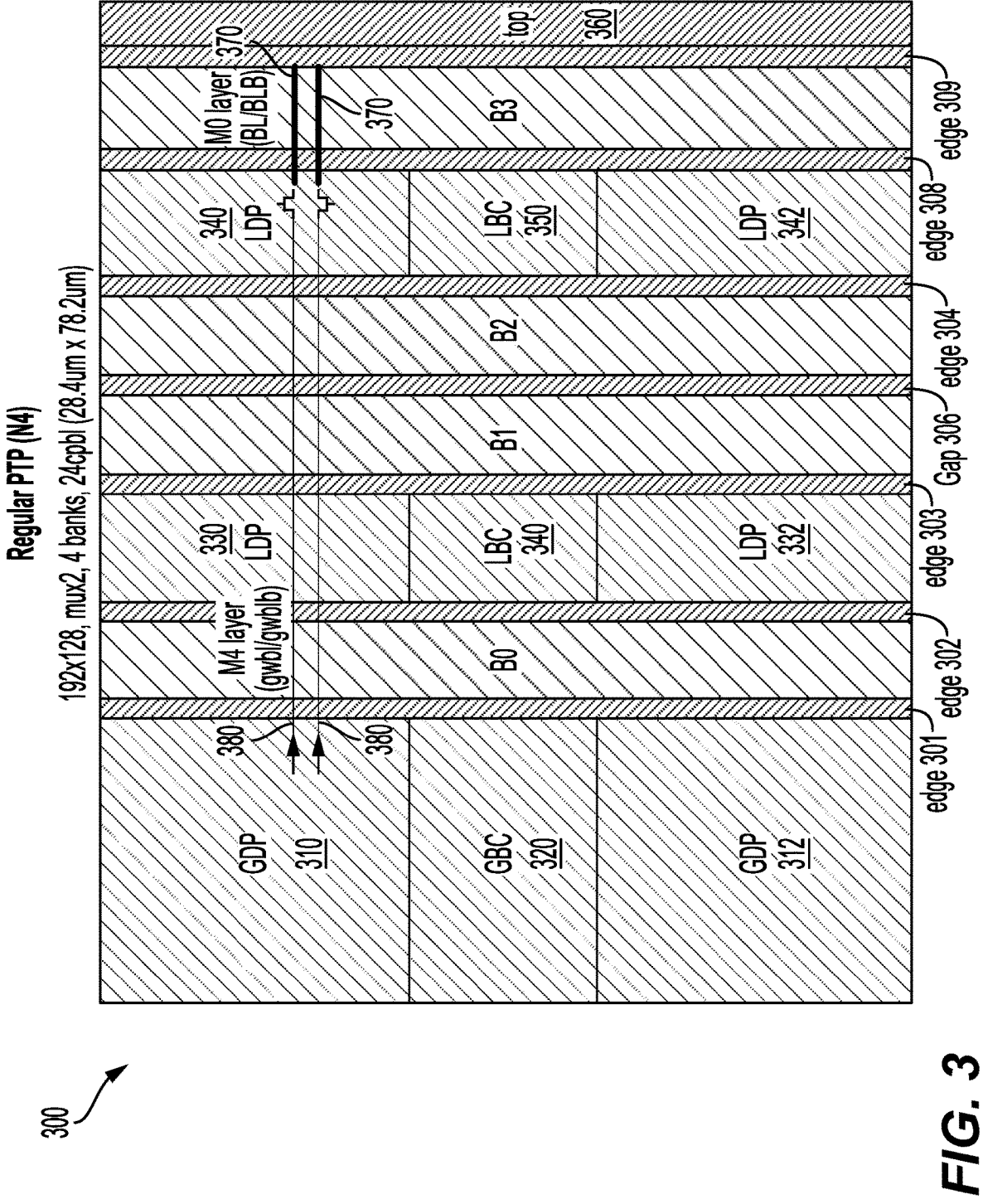
FIG. 3 is a schematic diagram illustrating a four-bank PTP memory architecture, according to various aspects of the present disclosure.

FIG. 3 is a schematic diagram illustrating a four-bank pseudo-triple-port (PTP) memory architecture 300, according to various aspects of the present disclosure. As described, a bank refers to a subdivision of a column of bitcells, such that the bitcells in a column assigned to one bank shares global read bitlines with the bitcells in the corresponding column assigned to a neighboring bank. For example, suppose a column of bitcells is split into an upper bank column and a lower bank column. There is thus a global read bitline A (GRBLA) for read port A and a global read bitline B (GRBLB) for read port B that are shared by the upper bank column and the lower bank column. In some implementations, multiple columns in each bank share a pair of global read bitlines. Suppose that two columns in each bank also share the pair of global read bitlines. The two columns in each bank are thus multiplexed by a global read bitline multiplexer onto a global read bitline depending upon which column and bank is being accessed and depending upon which read port is being accessed.

As shown in FIG. 3, the four-bank PTP memory architecture 300 includes banks B0 (e.g., a zero bitcell bank), B1 (e.g., a first bitcell bank), B2 (e.g., a second bitcell bank), and B3 (e.g., a third bitcell bank), in which the bank B0 is arranged between bitcell edges 301, 302. Similarly, the bank B3 is arranged between bitcell edges 308, 309. In this example, the banks B1 and B2 are separated by a gap cell 306, which may be implemented using a substrate that is placed along broken bitlines to prevent a short between the banks B1 and B2, which are collectively arranged between bitcell edges 303, 304. In this example, the number of bitcell edges is two bitcell edges per bank, which are provided to comply with N-type well (Nwell) to Nwell foundry spacing rules.

Additionally, the four-bank PTP memory architecture 300 includes an upper global data path (GDP) 310 and a lower GDP 312 with a global bank controller (GBC) 320 separating the upper GDP 310 from the lower GDP 312. The four-bank PTP memory architecture 300 further includes a first upper, local data path (LDP) 330 and a first lower LDP 332, with a first local bank controller (LBC) 340 separating the first upper LDP 330 from the first lower LDP 332. Additionally, the four-bank PTP memory architecture 300 includes a second upper LDP 340 and a second lower LDP 342, with a second GBC 350 separating the second upper LDP 340 from the second lower LDP 342. The four-bank PTP memory architecture 300 also includes a top row decoder 360.

As shown in FIG. 3, a bitline connection 370 (e.g., bitline (BL) and bitline bar (BLB)) between bank B3 and the second upper LDP 340 is provided using a zero metal (M0) layer. Similarly, the M0 metal layer (not shown) provides a bitline connection between banks B0 and B1 to the first upper LDP 330, and the bitline connection (not shown) between bank B2 and the second upper LDP 340. Unfortunately, a fourth (M4) metal layer provides a global write bitline connection 380 (e.g., global write bitline (GWBL) and global write bitline bar (GWBLB)) between the second upper LDP 340 and the upper GDP 310 consumes read/write dynamic power.

Figure 4:
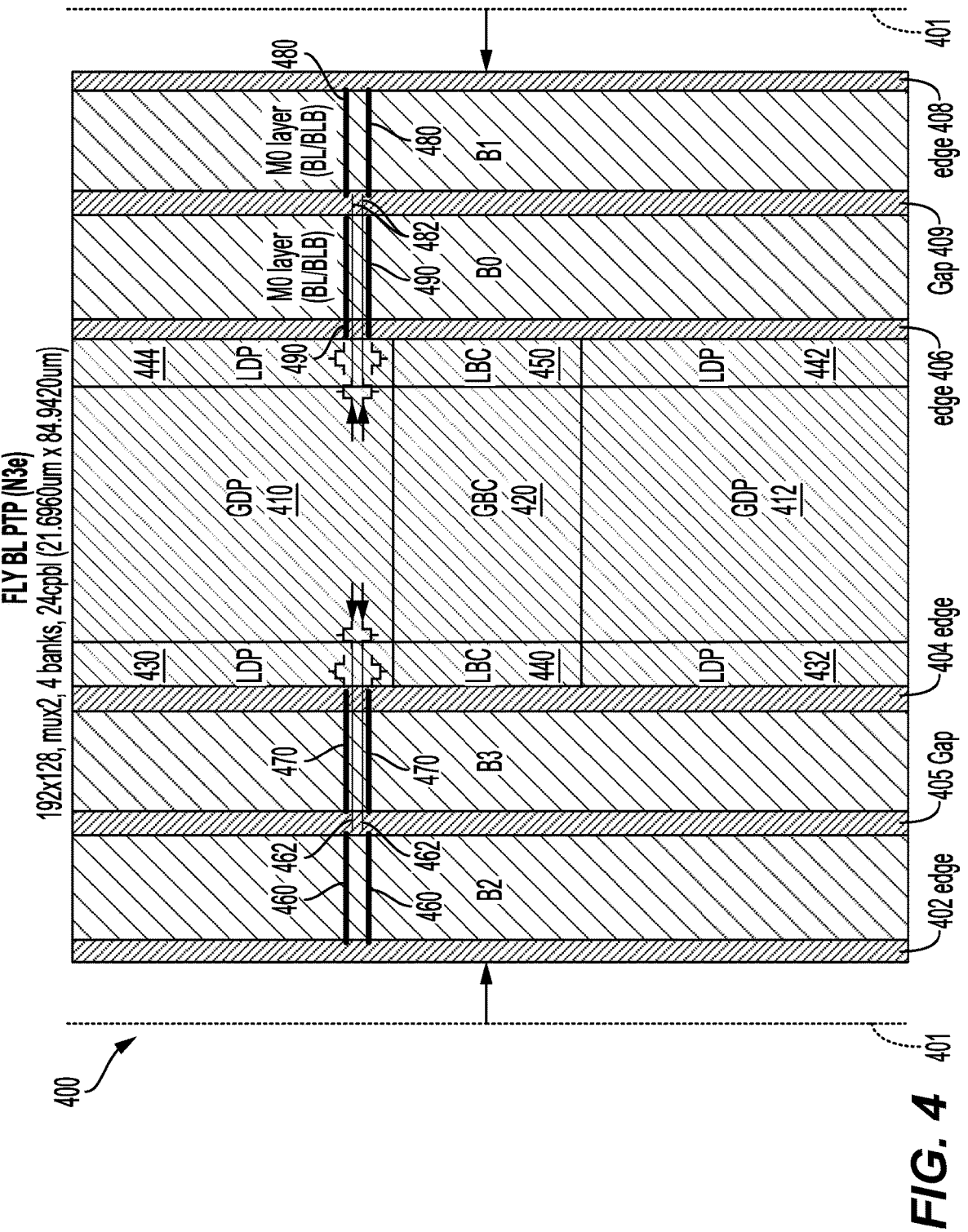
FIG. 4 is a schematic diagram illustrating a four-bank PTP memory fly bitline architecture, according to various aspects of the present disclosure.

FIG. 4 is a schematic diagram illustrating a four-bank PTP memory fly bitline architecture 400, according to various aspects of the present disclosure. As shown in FIG. 4, the four-bank PTP memory fly bitline architecture 400 rearranges banks B0, B1, B2, and B3, in which the banks B2 and B3 are separated by a gap cell 405 and collectively arranged between bitcell edges 402, 404. Additionally, the banks B0 and B1 are separated by a gap cell 409 and collectively arranged between bitcell edges 406, 408, distal from the banks B2 and B3. Rearranging the banks B0, B1, B2, and B3 provides an approximately eighteen percent (18%) reduction (e.g., approximately six (6) microns in an x-direction) of the four-bank PTP memory fly bitline architecture 400 relatives to a footprint 401 of the four-bank PTP memory architecture 300 of FIG. 3.

In some aspects of the present disclosure, the four-bank PTP memory fly bitline architecture 400 rearranges peripheral logic to a center of the four-bank PTP memory architecture 300. In this example, an upper GDP 410 and a lower GDP 412 are arranged along a central line with a GBC 420 separating the upper GDP 410 from the lower GDP 412. The four-bank PTP memory fly bitline architecture 400 further includes a first upper LDP 430 and a first lower LDP 432, with a first local bank controller (LBC) 440 separating the first upper LDP 430 from the first lower LDP 432. Additionally, the four-bank PTP memory fly bitline architecture 400 includes a second upper LDP 444 and a second lower LDP 442, with a second LBC 450 separating the second upper LDP 444 from the second lower LDP 442.

As shown in FIG. 4, a bitline connection 470 (e.g., bitline (BL) and bitline bar (BLB)) between bank B3 and a first terminal and a second terminal of the first upper LDP 430 is provided using an M0 metal layer. Similarly, the M0 metal layer provides a bitline connection 490 between the bank B0 and the second upper LDP 444. The bank B2 includes a bitline connection 460 to the gap cell 405, which is implemented using an M0 metal layer. Similarly, the bank B1 includes a bitline connection 480 to the gap cell 409, which is also implemented using an M0 metal layer. In some aspects of the present disclosure, a fly bitline is provided in the gap cell 405 to provide a connection between a bitline connection 460 of the bank B2 and a write bitline connection 462 to the first upper LDP 430, implemented using a fourth (M4) metal layer. Similarly, a fly bitline is provided in the gap cell 409 to provide a connection between a bitline connection 480 of the bank B1 and a write bitline connection 482 to the second upper LDP 444, implemented using an M4 metal layer.

In some aspects of the present disclosure, the fly bitlines provided by the gap cell 405 and the gap cell 409 eliminate the global write bitline connection 380 between the second upper LDP 340 and the upper GDP 310 of the four-bank PTP memory architecture 300 of FIG. 3. Elimination of the global write bitline connection 380 improves a read/write dynamic power of the four-bank PTP memory fly bitline architecture 400. In some aspects of the present disclosure, the size reduction of the four-bank PTP memory fly bitline architecture 400 is further achieved by eliminating the top row decoder 360 of FIG. 3. For example, a head switch of the top row decoder 360 may be incorporated in the upper GDP 410 and/or the lower GDP 412, which brings the head switch closer to the GBC 420.

Additionally, due to the center configuration of the peripheral circuitry, the number of bitcell edges for each of the banks B0, B1, B2, and B3 are reduced from six cell edges (e.g., 301, 302, 303, 304, 308, and 309) to four cell edges (e.g., 402, 404, 406, and 408). This center configuration of the peripheral circuitry enables the four-bank PTP memory fly bitline architecture 400 to avoid a significant area overhead due to the different Nwell potential spacing rules between the LDP and bitcell banks. That is, the number of bitcell edges is reduced to the four cell edges (e.g., 402, 404, 406, and 408), which improves compliance with the noted Nwell to Nwell foundry spacing rules.

Some example architectures for pseudo-triple-port bitcells will now be discussed. Regarding this architecture, note that substantial time and effort has been developed to implement a conventional six-transistor (6T) bitcell to minimize defects and provide the desired readability and writability. If this architecture is then disturbed to accommodate the disclosed pseudo-triple-port innovation, the write and read margins may suffer and the manufacturing defects may increase. Such a conventional 6T bitcell is traditionally accessed with a single wordline. In contrast, the disclosed 6T bitcells are accessed through a pair of wordlines that are controlled independently during a read operation depending upon which read port is being used. The following bitcell architectures (which may also be denoted as a layout) leverage the traditional 6T architecture such that the same advantageous "front-end" design may be recycled despite the pseudo-triple-port modifications.

FIG. 5 illustrates a cross-section of a semiconductor device 500 and metal layers for a split wordline implementation, in accordance with aspects of the present disclosure. To better appreciate what is meant by a front-end design and the associated semiconductor manufacturing process, the cross-section of a semiconductor device 500 is shown in FIG. 5. The transistors and other active devices are implemented on a semiconductor substrate. To provide power, ground, and the various signals used by the transistors, metal layers adjacent to the semiconductor substrate are patterned into the appropriate leads or conductors. For example, a first metal layer M1 is a first back-end-of-line (BEOL) layer adjacent to the semiconductor substrate. Additional metal layers above metal layer M1 are consecutively numbered such that there is a second metal layer M2, a third metal layer M3, a fourth metal layer M4, and a fifth metal layer M5. Additional metal layers above M5 may also be used but are not shown for illustration clarity. In addition, a zeroth metal layer used for interconnects directly to the active devices on the semiconductor substrate is also not shown for illustration clarity. The front-end design concerns the layout for the semiconductor substrate and the zeroth metal layer. The layout for the remaining metal layers M1 through M5 (and any higher order metal layers) is denoted as the back-end design.

To keep the advantageous, write margins, read margins, and other properties that are designed into a conventional 6T SRAM bitcell, the front-end design is left undisturbed. In some aspects of the present disclosure, the back-end design is reconfigured to modify the M1 metal layer from its layout for a conventional 6T bitcell. Advantageously, the global bitlines, the global write lines, and the wordlines for the pseudo-triple-port bitcells are implemented through changes to just metal layers M1, M2, M3, M4, and M5. It should be recognized that the zero (M0) metal layer, which provides a connection between the M1 metal layer, and an oxide diffusion (OD) layer of the substrate is not shown, as the M0 metal layer is unchanged in the implementation of a pseudo-triple-port high current (PTPHC) bitcell, for example, as shown in FIG. 6.

Figure 6:
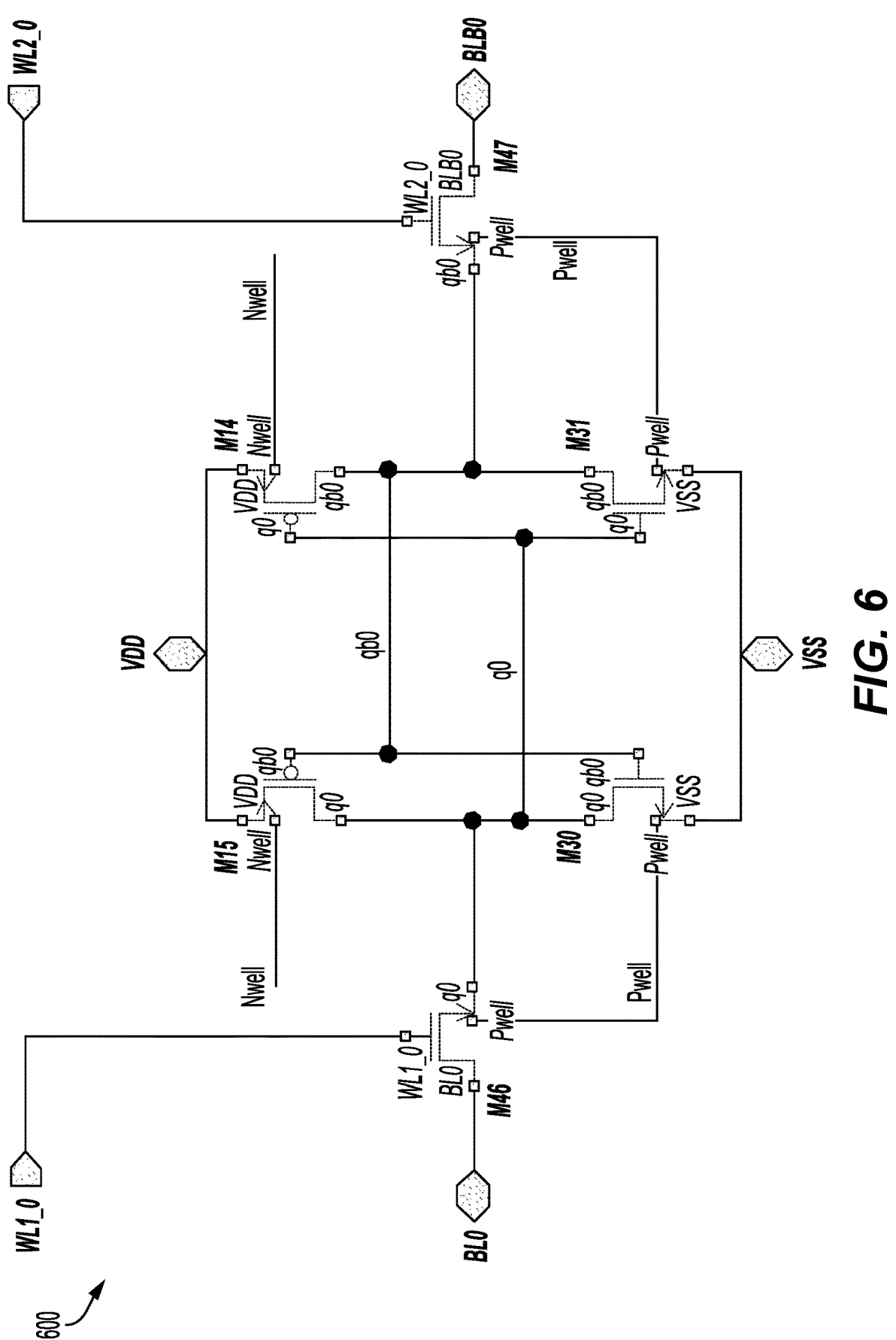
FIG. 6 is a circuit diagram illustrating a pseudo-triple-port high current (PTPHC) bitcell, having split wordlines, according to various aspects of the present disclosure.

FIG. 6 is a circuit diagram illustrating a pseudo-triple-port high current (PTPHC) bitcell 600, having split wordlines, according to various aspects of the present disclosure. As shown in FIG. 6, the bitlines BL0 and BLB0 as well as access transistors M46 and M47 are arranged as discussed for bitcells 205 and 210 of FIG. 2. The cross-coupled inverter driving the q0 output node is formed by a serial combination of a PMOS transistor M15 and an NMOS transistor M30. Similarly, the cross-coupled inverter driving the qb0 output node is formed by a serial combination of a PMOS transistor M14 and an NMOS transistor M31. The sources of the transistors M15 and M14 are connected to the power supply node for the power supply voltage VDD. Similarly, the sources of the transistors M30 and M31 are connected to ground. The q0 output node drives the gates of the transistors M14 and M31 whereas the qb0 output node drives the gates of the transistors M15 and M30.

Figure 7:
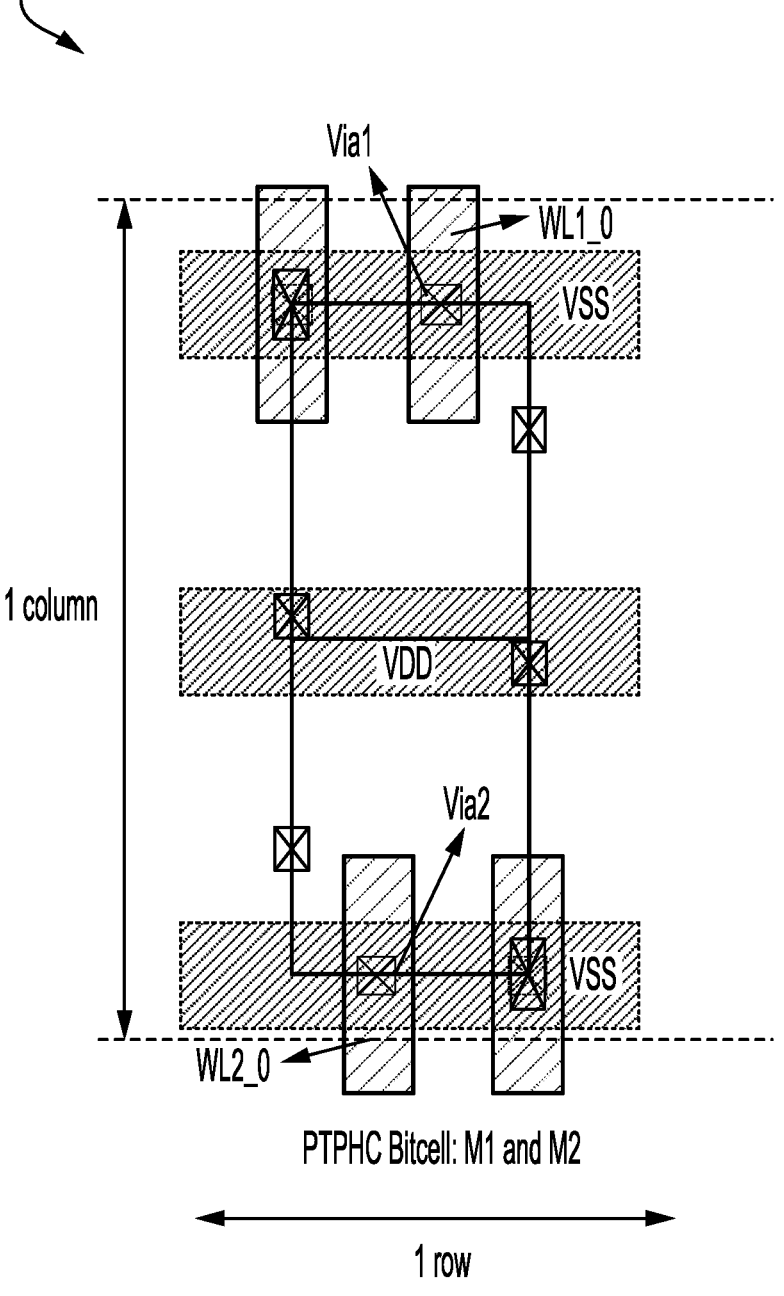
FIG. 7 is a schematic diagram illustrating a layout structure for the PTPHC bitcell of FIG. 6, having split wordlines, according to various aspects of the present disclosure.

FIG. 7 is a schematic diagram illustrating a layout structure 700 for the pseudo-triple-port high current (PTPHC) bitcell 600 of FIG. 6, having split wordlines, according to various aspects of the present disclosure. In FIG. 7, the layout structure 700 omits the six transistors M14, M15, M30, M31, M46, and M47 of the PTPHC bitcell 600 of FIG. 6. These transistors are part of the front-end design, which is left undisturbed in aspects of the present disclosure. That is, as discussed previously, an optimized 6T SRAM bitcell layout is advantageously preserved despite the pseudo-triple-port modifications described.

The layout structure 700 of the PTPHC bitcell 600 of FIG. 6 illustrates the M1 metal layer and the M2 metal layer. In this aspect of the present disclosure, the M1 metal layer is patterned to provide a first wordline WL1_0 and a second wordline WL2_0. In this example, the first wordline WL1_0 and the second wordline WL2_0 have a length of 156 nanometers (nm) and a width of 28 nm. The layout structure 700 further illustrates the M2 metal layer patterned to provide a first ground rail (VSS) contacted to the first wordline WL1_0 using Via1 (e.g., a V1 metal layer via). Similarly, a second VSS ground rail is contacted to the second wordline WL2_0 using Via2 (e.g., a V2 metal layer via).

In this example, the M2 metal layer is further patterned to provide a VDD power rail between the first and second VSS ground rails, in which each of these rails are shown with a width of 42 nm, which is expanded for conventional arrangements. In this example, the first wordline WL1_0, the second wordline WL2_0, the first and second VSS ground rails, and the VDD power rail are arranged in the layout structure 700 of the PTPHC bitcell 600, as defined by a column height and a row width. In this example, the bitcell height (which may also be denoted as the row height) is less than the bitcell width (which may also be denoted as the column width); however, the formation of the first wordline WL1_0, and the second wordline WL2_0 enables placement in the M1 metal layer within the row height without affecting the 6T bitcell layout.

Figure 8:
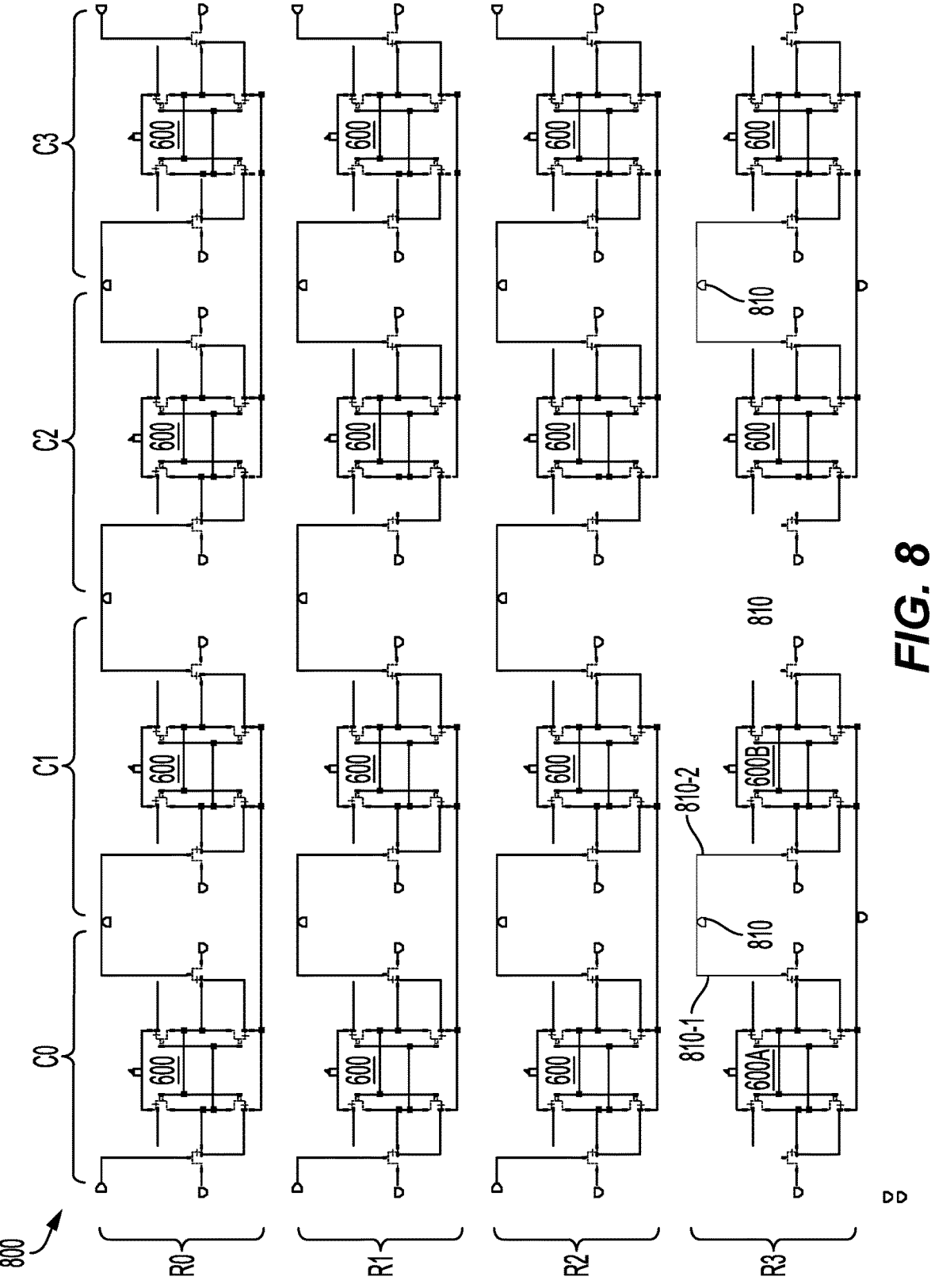
FIG. 8 is a schematic diagram illustrating a four by four (4×4) array of the PTPHC bitcell of FIG. 6, according to various aspects of the present disclosure.

FIG. 8 is a schematic diagram illustrating a four by four (4×4) array of the PTPHC bitcell of FIG. 6, according to aspects of the present disclosure. In this example, the PTPHC bitcell 600 of FIG. 6 is arranged in a PTPHC bitcell array 800, having four rows (R0, R1, R2, and R3) and four columns (C0, C1, C2, and C3). In some aspects of the present disclosure, the wordlines of the PTPHC bitcell 600 of the PTPHC bitcell array 800 are contacted through upper metal layers (e.g., M2, M3, M4, and/or M5) using strapped wordlines. In various aspects of the present disclosure, the M5 metal layer connections provide a pair of strapped wordlines. In this example, a first strapped wordline connection 810-1 is between the second wordline WL2 of a first PTPHC bitcell 600A and a first wordline WL1 of a second PTPHC bitcell 600B. For example, the first strapped wordline connection 810-1 may provide a first read wordline, and the second strapped wordline connection 810-2 may provide a second read wordline. Additionally, the first strapped wordline connection 810-1 may provide a first write wordline, and the second strapped wordline connection 810-2 may provide a second write wordline.

FIGS. 9A and 9B are schematic diagrams illustrating top views of back-end-of-line (BEOL) metal layers to implement the strapped wordline connections 810 of the PTPHC bitcell array 800 of FIG. 8, according to aspects of the present disclosure.

FIG. 9A is a top view of a four by four (4×4) bitcell schematic 900 of the M2 and M3 metal layer connections to provide the strapped wordline connections 810 of the PTPHC bitcell array 800 of FIG. 8. In this example, the bitcell schematic 900 of the M2 and M3 metal layer connections overlays the PTPHC bitcell array 800, when the bitcell schematic 900 is rotated clockwise by ninety degrees (90°). In particular, the bitcell schematic 900 is also shown as having four rows (R0, R1, R2, and R3) and four columns (C0, C1, C2, and C3), corresponding to the rows and columns of the PTPHC bitcell array 800 of FIG. 8.

In some aspects of the present disclosure, the M2 metal layer is adjacent to an M1 metal layer (not shown) and patterned to provide M2 metal layer islands 920. In this example, the M2 metal layer islands 920 include a V1 via connection to an M1 metal layer (e.g., the first wordline WL1_0 or the second wordline WL2_0) and a V2 via connection to a M3 metal layer interconnect. For example, a PTPHC bitcell corresponding to row R0 and column C0 includes a M2 metal layer island 920-1 having a V1 via connection corresponding to a WL2 wordline and an M3 metal layer interconnect. Similarly, the PTPHC bitcell corresponding to row R0 and column C0 includes a M2 metal layer island 920-2 having a V1 via connection corresponding to a WL1 wordline and an M3 metal layer interconnect. In this example, eight (8) parallel M3 metal layer interconnects are shown. Additionally, the VDD power rail between the first and second VSS ground rails of FIG. 7 are shown. Via V3 connections to M4 metal layer islands are also shown, as further illustrated in FIG. 9B.

FIG. 9B is a top view of a two by two (2×2) bitcell schematic 950 of the M4 and M5 metal layer connections to provide the strapped wordline connection 810 of the PTPHC bitcell array 800 of FIG. 8. In this example, the bitcell schematic 950 of the M4 and M5 metal layer connections overlay the bitcell schematic 900 of FIG. 9A. In various aspects of the present disclosure, the M4 metal layer is adjacent to the M3 metal layer of FIG. 9A and patterned to provide M4 metal layer islands 960 (e.g., pair of fourth metal layer islands). In this example, a pair of M4 metal layer islands 960 include the V3 via connection to the M3 metal layer interconnects of FIG. 9A, and V4 via connections to M5 metal layer interconnects. In this example, eight (8) double patterned parallel M5 metal layer interconnects are strapped on top of the M3 metal layer interconnects of FIG. 9A for improved resistance and to complete formation of the strapped wordline connections 810 of FIG. 8.

Figures 10A, 10B:
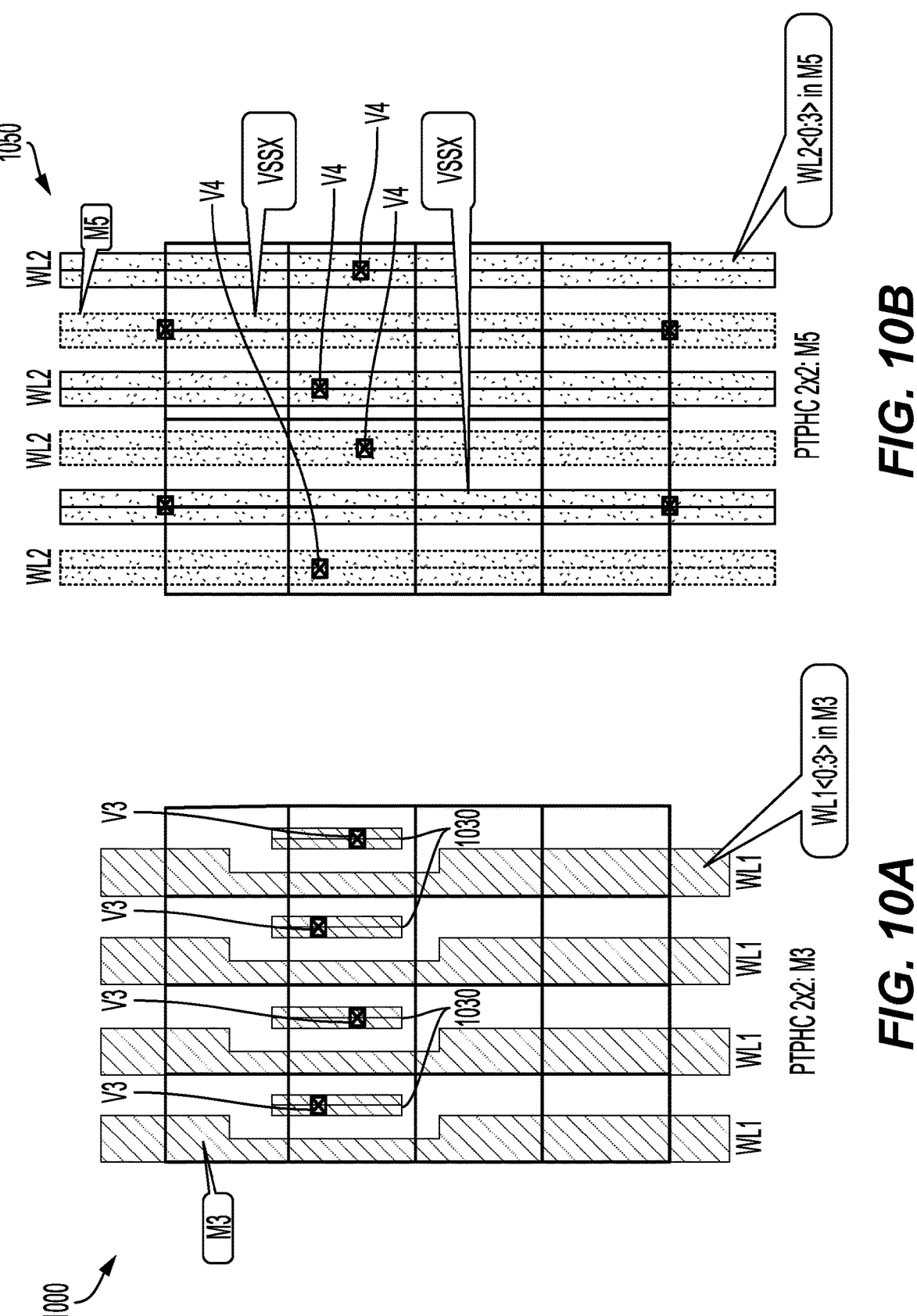
FIGS. 10A and 10B are schematic diagrams illustrating top views of back-end-of-line (BEOL) metal layers to implement the strapped wordline connection of the PTPHC bitcell array of FIG. 8, according to further aspects of the present disclosure.

FIGS. 10A and 10B are schematic diagrams illustrating top views of back-end-of-line (BEOL) metal layers to implement the strapped wordline connections 810 of the PTPHC bitcell array 800 of FIG. 8, according to further aspects of the present disclosure.

FIG. 10A is a top view of a two by two (2×2) bitcell schematic 1000 of the M3 metal layer connections to provide the strapped wordline connections 810 of the PTPHC bitcell array 800 of FIG. 8. In this example, the bitcell schematic 1000 of the M3 metal layer connections overlays the PTPHC bitcell array 800 of FIG. 8. In some aspects of the present disclosure, the M3 metal layer is adjacent to an M2 metal layer (not shown) and patterned to form M3 metal layer islands 1030 to provide first wordline WL1 connections. In this example, the M3 metal layer islands 1030 include a V3 via connection to M4 metal layer islands (not shown). In this example, four parallel M3 metal layer interconnects are shown with an expanded width (e.g., 52 nm) and spacing (e.g., 44 nm), including a narrowed portion (e.g., 26 nm width by a 230 nm length), proximate the M3 metal layer islands 1030 (e.g., having a 21 nm width and a 140 nm length).

FIG. 10B is a top view of a two by two (2×2) bitcell schematic 1050 of the M5 metal layer connections to provide the strapped wordline connections 810 of the PTPHC bitcell array 800 of FIG. 8. In this example, the bitcell schematic 1050 of the M5 metal layer interconnects overlay the bitcell schematic 1000 of FIG. 10A. In this example, the M5 metal layer interconnects include V4 via connections to the M3 metal layer islands 1030 of FIG. 10A, through M4 metal layer islands (not shown). In this example, six parallel M5 metal layer interconnects are shown, in which four of the M5 metal layer interconnections provide the second wordline WL2 connections. Additionally, M5 metal layer interconnects (VSSX) are also shown to provide VSS shielding for the other M5 metal layer interconnects.

FIGS. 11A, 11A-1, 11B, and 11C are schematic diagrams illustrating banks B2 and B3 and the gap cell 405 of the four-bank PTP memory fly bitline architecture 400 of FIG. 4, according to various aspects of the present disclosure.

Figure 11A:
Figures 1, 11A:
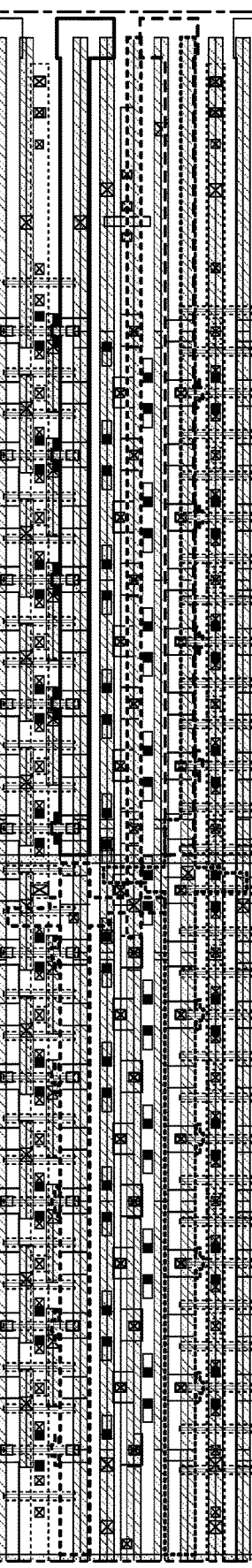
Figure 11B:
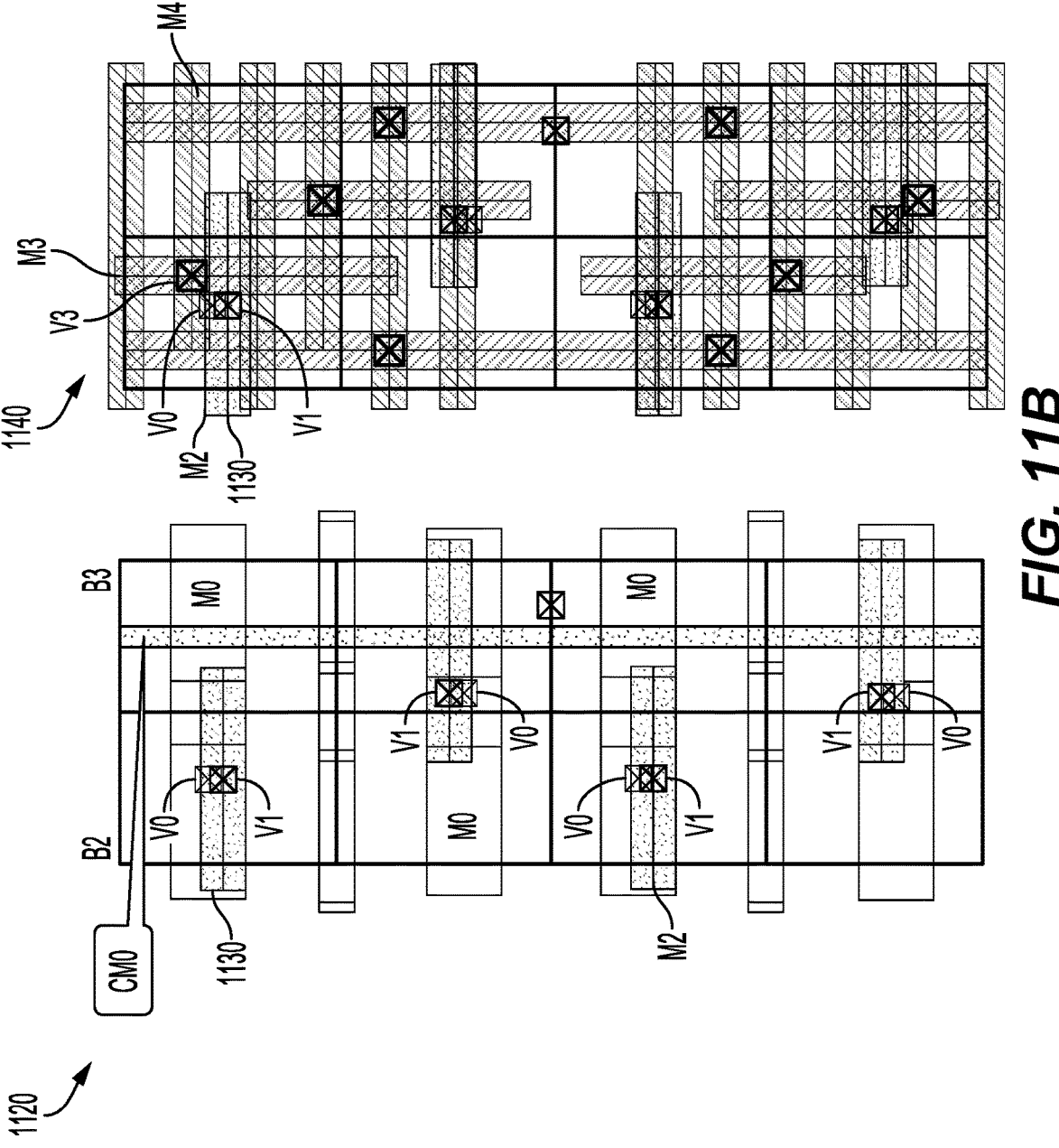

FIG. 11B is a schematic diagram illustrating a first top view schematic diagram 1120 and a second top view schematic diagram 1140 of an exploded portion 1110 of the gap cell 405 of FIGS. 11A and 11A-1 to illustrate the fly bitline connections of the bank B3 of FIG. 4, according to aspects of the present disclosure. In this example, the first top view schematic diagram 1120 illustrates the M0 and M2 metal layer connections of the gap cell 405 between banks B2 and B3, for example, as shown in FIG. 4. In some aspects of the present disclosure, a cut metal zero (CM0) line is provided to separate the bank B2 from the bank B3. In this example, an M2 metal layer is adjacent to an M1 metal layer (not shown) and patterned to provide M2 metal layer islands 1130. For example, the M2 metal layer islands 1130 include a V0 via connection to the M0 metal layer and M1 metal layer (not shown). Additionally, a V1 via connection is provided between the M1 metal layer (not shown) and the M2 metal layer islands 1130.

The second top view schematic diagram 1140 of the exploded portion of the gap cell 405 of FIG. 11B illustrates the fly bitline connection between the M0 metal layer and an M4 metal layer. The M2 metal layer island has a V2 via connection to the M3 metal layer interconnect as well a V1 via connection to the M1 metal layer (not shown) and a V0 via connection between the M0 metal layer and the M1 metal layer (not shown). In this example, a V3 via connection between the M3 metal layer interconnect and the M4 metal layer is also shown, as further illustrated in FIG. 11C.

Figure 11C:
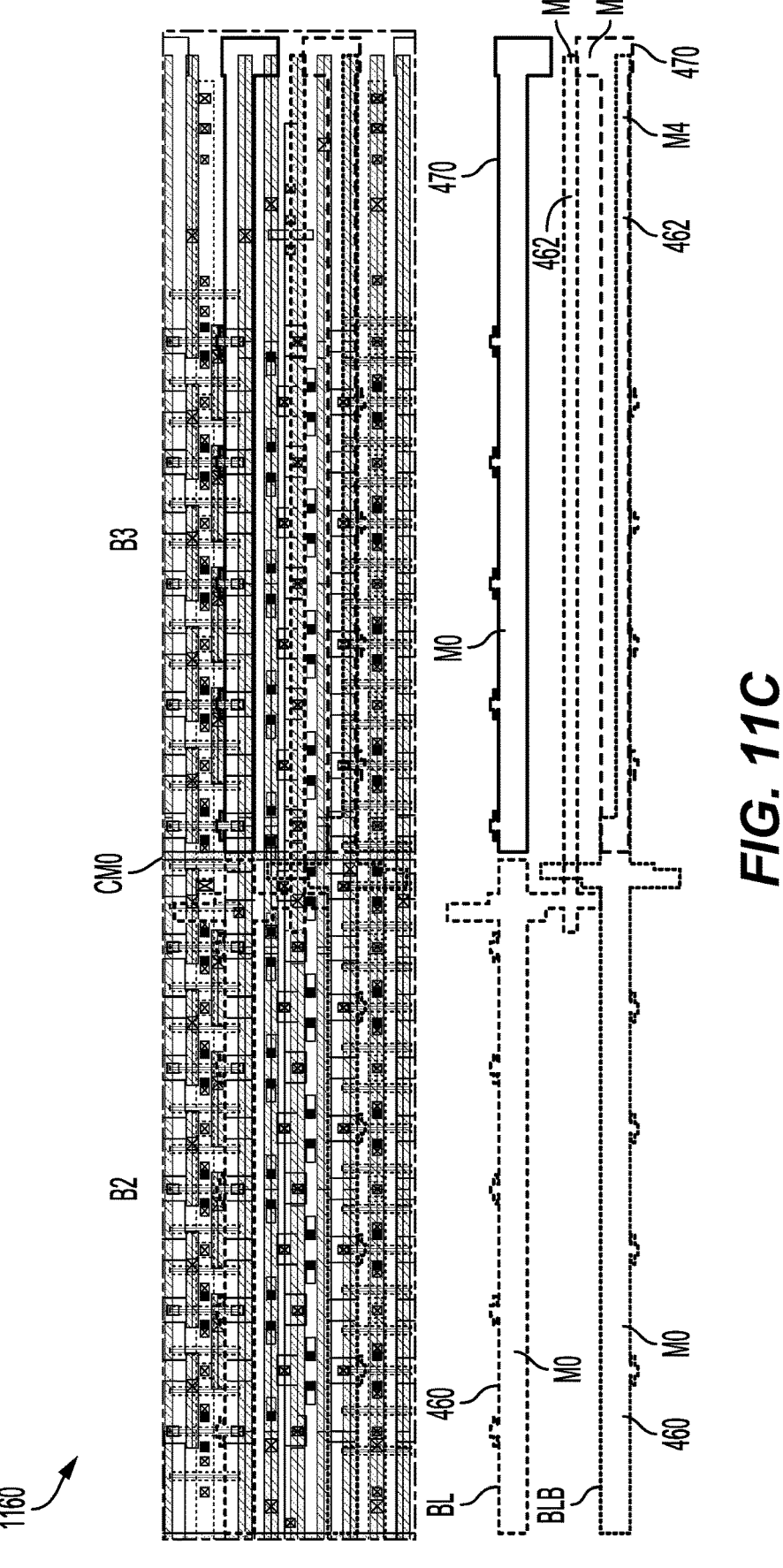

FIG. 11C is a schematic diagram 1160 illustrating a cross-sectional view of the first top view schematic diagram 1120 of the exploded portion 1150 of the banks B2 and B3 of FIGS. 11A and 11A-1 to illustrate the bitline connections of the banks B2 and B3 of FIG. 4, according to aspects of the present disclosure. In this example, a bitline connection 470 (e.g., bitline (BL) and bitline bar (BLB)) between the bank B3 and the first upper LDP 430 (see FIG. 4) is provided using an M0 metal layer. The bank B2 includes a bitline connection 460 to the gap cell 405, which is implemented using the M0 metal layer. In some aspects of the present disclosure, a fly bitline is provided in the gap cell 405 to provide a connection between a bitline connection 460 of the bank B2 and a write bitline connection 462 to the first upper LDP 430 (see FIG. 4), implemented using the M4 metal layer.

FIG. 12 is a process flow diagram illustrating a method 1200 for fabricating a memory, according to various aspects of the present disclosure. The method 1200 includes, at block 1202 forming a bitcell arranged on a semiconductor substrate, the bitcell having a bitcell width and a bitcell height and including a first access transistor and a second access transistor. The formation of bitcell 600 is an example of the step described at block 1202. For example, FIG. 6 is a circuit diagram illustrating a pseudo-triple-port high current (PTPHC) bitcell 600, having split wordlines, according to various aspects of the present disclosure.

The method 1200 further includes, at block 1204, patterning a first metal layer adjacent the semiconductor substrate to form a first pair of wordlines arranged within the bitcell height, the first pair of wordlines including a first wordline coupled to a gate of the first access transistor and including a second wordline coupled to a gate of the second access transistor. The patterning of metal layer M1 to form the first pair of wordlines is an example of the step described at block 1204. For example, as shown in FIG. 7, the M1 metal layer is patterned to provide a first wordline WL1_0 and a second wordline WL2_0.

The method 1200 further includes, at block 1206, patterning a second metal layer adjacent the first metal layer to form a pair of second metal layer islands within the bitcell width, the pair of second metal layer islands including a first island coupled to the first wordline and a second island coupled to the second wordline. For example, as shown in FIG. 9A, the M2 metal layer is adjacent to an M1 metal layer (not shown) and patterned to provide M2 metal layer islands 920. In this example, the M2 metal layer islands 920 include a V1 via connection to an M1 metal layer (e.g., the first wordline WL1_0 or the second wordline WL2_0) and a V2 via connection to a M3 metal layer interconnect.

Finally, the method 1200 includes, at block 1208, patterning a third metal layer adjacent the second metal layer to form a pair of third metal layer interconnects, including a first interconnect coupled to the first island and a second interconnect coupled to the second island. For example, as shown in FIG. 9A, a PTPHC bitcell corresponding to row R0 and column C0 includes a M2 metal layer island 920-1 having a V1 via connection corresponding to a WL2 wordline and an M3 metal layer interconnect. Similarly, the PTPHC bitcell corresponding to row R0 and column C0 includes a M2 metal layer island 920-2 having a V1 via connection corresponding to a WL1 wordline and an M3 metal layer interconnect. In this example, eight (8) parallel M3 metal layer interconnects are shown. Additionally, the VDD power rail between the first and second VSS ground rails of FIG. 7 are shown. Via V3 connections to M4 metal layer islands are also shown, as further illustrated in FIG. 9B.

Figure 13:
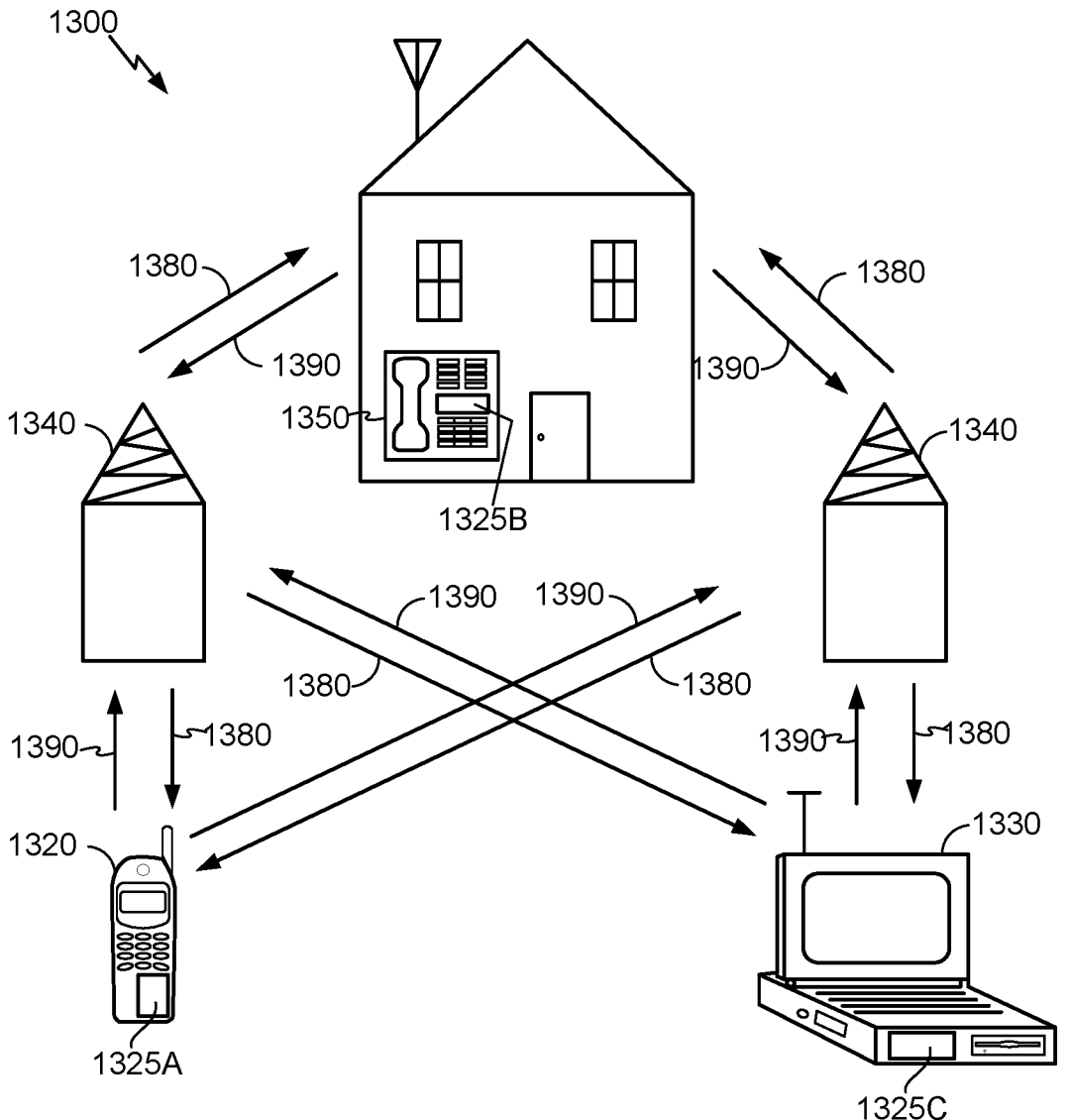
FIG. 13 is a block diagram showing an exemplary wireless communications system in which a configuration of the disclosure may be advantageously employed.

FIG. 13 is a block diagram showing an exemplary wireless communications system 1300 in which an aspect of the disclosure may be advantageously employed. For purposes of illustration, FIG. 13 shows three remote units 1320, 1330, and 1350, and two base stations 1340. It will be recognized that wireless communications systems may have many more remote units and base stations. Remote units 1320, 1330, and 1350 include IC devices 1325A, 1325C, and 1325B that include the disclosed fly bitline design. It will be recognized that other devices may also include the disclosed fly bitline design, such as the base stations, switching devices, and network equipment. FIG. 13 shows forward link signals 1380 from the base stations 1340 to the remote units 1320, 1330, and 1350, and reverse link signals 1390 from the remote units 1320, 1330, and 1350 to base stations 1340.

In FIG. 13, remote unit 1320 is shown as a mobile telephone, remote unit 1330 is shown as a portable computer, and remote unit 1350 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 13 illustrates remote units according to aspects of the present disclosure, the disclosure is not limited to these exemplary illustrated units. Aspects of the present disclosure may be suitably employed in many devices, which include the disclosed fly bitline design.

Figure 14:
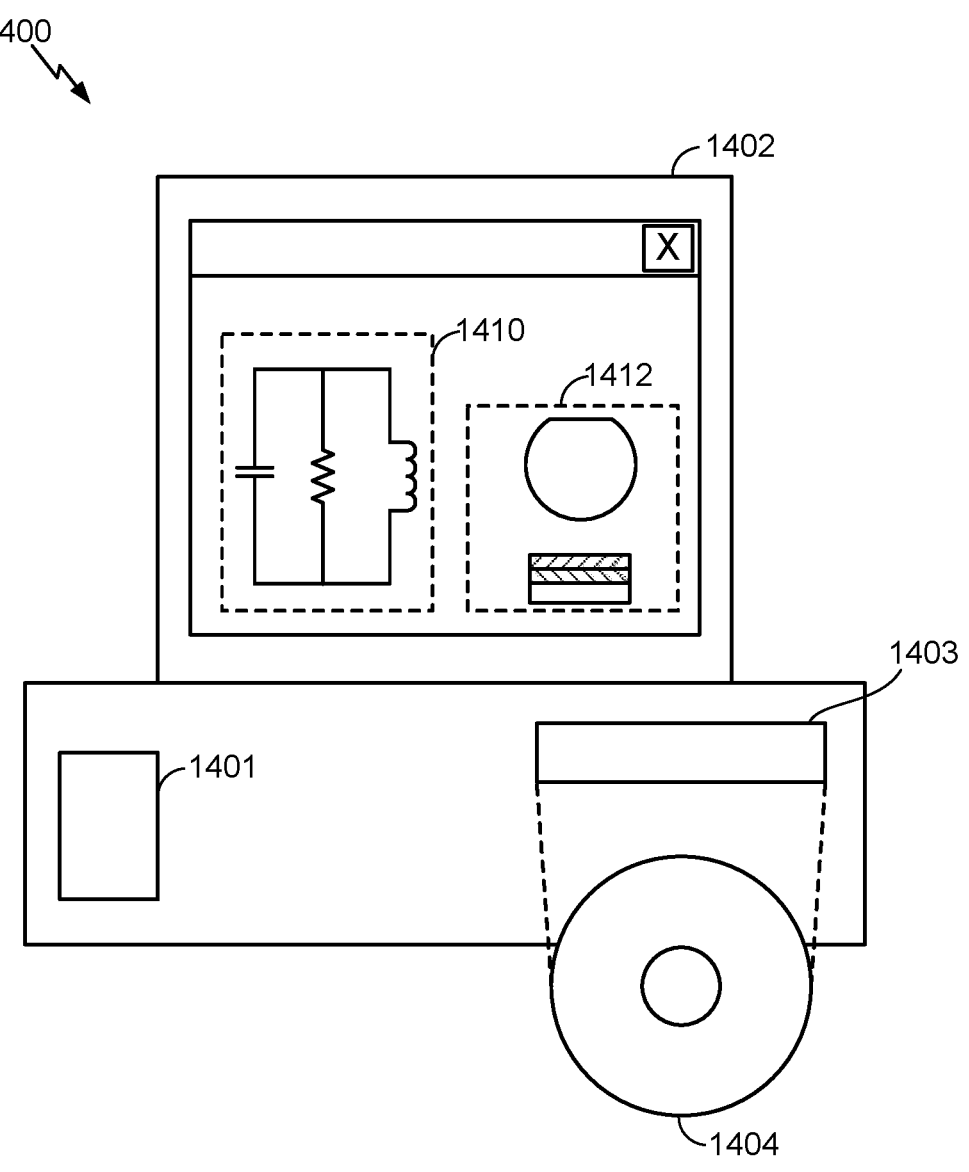
FIG. 14 is a block diagram illustrating a design workstation used for circuit, layout, and logic design of a semiconductor component according to one configuration.

FIG. 14 is a block diagram illustrating a design workstation used for circuit, layout, and logic design of a semiconductor component, such as the fly bitline design disclosed above. A design workstation 1400 includes a hard disk 1401 containing operating system software, support files, and design software such as Cadence or OrCAD. The design workstation 1400 also includes a display 1402 to facilitate design of a circuit 1410 or an integrated circuit (IC) component 1412 such as a fly bitline design. A storage medium 1404 is provided for tangibly storing the design of the circuit 1410 or the IC component 1412 (e.g., the fly bitline design). The design of the circuit 1410 or the IC component 1412 may be stored on the storage medium 1404 in a file format such as GDSII or GERBER. The storage medium 1404 may be a CD-ROM, DVD, hard disk, flash memory, or other appropriate device. Furthermore, the design workstation 1400 includes a drive apparatus 1403 for accepting input from or writing output to the storage medium 1404.

Data recorded on the storage medium 1404 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1404 facilitates the design of the circuit 1410 or the IC component 1412 by decreasing the number of processes for designing semiconductor wafers.

Implementation examples are described in the following numbered clauses:

1. A memory, comprising:
   a semiconductor substrate;
   a bitcell on the semiconductor substrate, the bitcell having a bitcell width and a bitcell height and including a first access transistor and a second access transistor;
   a first metal layer adjacent the semiconductor substrate, the first metal layer patterned to form a first pair of wordlines arranged within the bitcell height, the first pair of wordlines including a first wordline coupled to a gate of the first access transistor and including a second wordline coupled to a gate of the second access transistor;
   a second metal layer adjacent the first metal layer, the second metal layer patterned to form a pair of second metal layer islands within the bitcell width, the pair of second metal layer islands including a first island coupled to the first wordline and a second island coupled to the second wordline; and
   a third metal layer adjacent the second metal layer, the third metal layer patterned to form a pair of third metal layer interconnects, including a first interconnect coupled to the first island and a second interconnect coupled to the second island.

2. The memory of clause 1, further comprising a fourth metal layer adjacent the third metal layer, the fourth metal layer patterned into a pair of fourth metal layer islands within the bitcell height, the pair of fourth metal layer islands including a first, fourth metal layer island coupled to the first interconnect and a second, fourth metal layer island coupled to the second interconnect.

3. The memory of clause 2, further comprising a fifth metal layer adjacent the fourth metal layer, the fifth metal layer being patterned into a pair of strapped wordlines, including a first strapped wordline coupled to the first, fourth metal layer island, and a second strapped wordline coupled to the second, fourth metal layer island.

4. The memory of clause 3, in which the pair of strapped wordlines comprises a first read wordline and a second read wordline.

5. The memory of clause 3, in which the pair of strapped wordlines comprises a first write wordline and a complement write wordline.

6. The memory of any of clauses 1-5, further comprising a zero metal (M0) layer adjacent to the second metal layer, the zero metal layer patterned to form a pair of local bitlines within the bitcell width, the pair of local bitlines including a local bitline coupled to a first terminal of a local data path (LDP) and including a complement local bitline coupled to a second terminal of the LDP.

7. The memory of clause 6, in which the pair of local bitlines are coupled to a gap cell.

8. The memory of clause 6, further comprising a fourth metal layer in a first bitcell bank coupled to the pair of local bitlines of the bitcell in a second bitcell bank.

9. The memory of any of clauses 1-8, further comprising a cut metal zero (CM0) line separating a first bitcell bank from a second bitcell bank.

10. The memory of any of clauses 1-9, in which the second metal layer is further patterned into a power rail between ground rails.

11. A method for memory fabrication, the method comprising:

forming a bitcell on a semiconductor substrate, the bitcell having a bitcell width and a bitcell height and including a first access transistor and a second access transistor;

patterning a first metal layer adjacent the semiconductor substrate to form a first pair of wordlines arranged within the bitcell height, the first pair of wordlines including a first wordline coupled to a gate of the first access transistor and including a second wordline coupled to a gate of the second access transistor;

patterning a second metal layer adjacent the first metal layer to form a pair of second metal layer islands within the bitcell width, the pair of second metal layer islands including a first island coupled to the first wordline and a second island coupled to the second wordline; and patterning a third metal layer adjacent the second metal layer to form a pair of third metal layer interconnects, including a first interconnect coupled to the first island and a second interconnect coupled to the second island.

12. The method of clause 11, further comprising patterning a fourth metal layer adjacent the third metal layer to form a pair of fourth metal layer islands within the bitcell height, the pair of fourth metal layer islands including a first, fourth metal layer island coupled to the first interconnect and a second, fourth metal layer island coupled to the second interconnect.

13. The method of clause 12, further comprising patterning a fifth metal layer adjacent the fourth metal layer to form a pair of strapped wordlines, including a first strapped wordline coupled to the first, fourth metal layer island, and a second strapped wordline coupled to the second, fourth metal layer island.

14. The method of clause 13, in which the pair of strapped wordlines comprises a first read wordline and a second read wordline.

15. The method of clause 13, in which the pair of strapped wordlines comprises a first write wordline and a complement write wordline.

16. The method of any of clauses 11-15, further comprising patterning a zero metal (M0) layer adjacent to the second metal layer to form a pair of local bitlines within the bitcell width, the pair of local bitlines including a local bitline coupled to a first terminal of a local data path (LDP) and including a complement local bitline coupled to a second terminal of the LDP.

17. The method of clause 16, in which the pair of local bitlines are coupled to a gap cell.

18. The method of clause 16, further comprising patterning a fourth metal layer in a first bitcell bank coupled to the pair of local bitlines of the bitcell in a second bitcell bank.

19. The method of any of clauses 11-18, further comprising patterning a cut metal zero (CM0) line separating a first bitcell bank from a second bitcell bank.

20. The method of any of clauses 11-19, in which the second metal layer is further patterned into a power rail between ground rails.

For a firmware and/or software implementation, the methodologies may be implemented with modules (e.g., procedures, functions, etc.) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform the same function or achieve the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the application and design constraints imposed on the overall system. Skilled artisans may implement the described functionality in varying ways for each application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A memory, comprising:
a semiconductor substrate;
a bitcell on the semiconductor substrate, the bitcell having a bitcell width and a bitcell height and including a first access transistor and a second access transistor;
a zero metal (M0) layer patterned to form a pair of local bitlines within the bitcell width, the pair of local bitlines including a local bitline coupled to a first terminal of a local data path (LDP) and including a complement local bitline coupled to a second terminal of the LDP;
a first metal layer adjacent the semiconductor substrate, the first metal layer patterned to form a first pair of wordlines arranged within the bitcell height, the first pair of wordlines including a first wordline coupled to a gate of the first access transistor and including a second wordline coupled to a gate of the second access transistor;
a second metal layer adjacent the M0 layer and the first metal layer, the second metal layer patterned to form a pair of second metal layer islands within the bitcell width, the pair of second metal layer islands including a first island coupled to the first wordline and a second island coupled to the second wordline; and
a third metal layer adjacent the second metal layer, the third metal layer patterned to form a pair of third metal layer interconnects, including a first interconnect coupled to the first island and a second interconnect coupled to the second island.

2. The memory of claim 1, further comprising a fourth metal layer adjacent the third metal layer, the fourth metal layer patterned into a pair of fourth metal layer islands within the bitcell height, the pair of fourth metal layer islands including a first, fourth metal layer island coupled to the first interconnect and a second, fourth metal layer island coupled to the second interconnect.

3. The memory of claim 2, further comprising a fifth metal layer adjacent the fourth metal layer, the fifth metal layer being patterned into a pair of strapped wordlines, including a first strapped wordline coupled to the first, fourth metal layer island, and a second strapped wordline coupled to the second, fourth metal layer island.

4. The memory of claim 3, in which the pair of strapped wordlines comprises a first read wordline and a second read wordline.

5. The memory of claim 3, in which the pair of strapped wordlines comprises a first write wordline and a complement write wordline.

6. The memory of claim 1, in which the pair of local bitlines are coupled to a gap cell.

7. The memory of claim 1, further comprising a fourth metal layer in a first bitcell bank coupled to the pair of local bitlines of the bitcell in a second bitcell bank.

8. The memory of claim 1, further comprising a cut metal zero (CM0) line separating a first bitcell bank from a second bitcell bank.

9. The memory of claim 1, in which the second metal layer is further patterned into a power rail between ground rails.

10. A method for memory fabrication, the method comprising:
forming a bitcell on a semiconductor substrate, the bitcell having a bitcell width and a bitcell height and including a first access transistor and a second access transistor;
patterning a zero metal (M0) layer to form a pair of local bitlines within the bitcell width, the pair of local bitlines including a local bitline coupled to a first terminal of a local data path (LDP) and including a complement local bitline coupled to a second terminal of the LDP;
patterning a first metal layer adjacent the semiconductor substrate to form a first pair of wordlines arranged within the bitcell height, the first pair of wordlines including a first wordline coupled to a gate of the first access transistor and including a second wordline coupled to a gate of the second access transistor;
patterning a second metal layer adjacent the M0 layer and the first metal layer to form a pair of second metal layer islands within the bitcell width, the pair of second metal layer islands including a first island coupled to the first wordline and a second island coupled to the second wordline; and
patterning a third metal layer adjacent the second metal layer to form a pair of third metal layer interconnects, including a first interconnect coupled to the first island and a second interconnect coupled to the second island.

11. The method of claim 10, further comprising patterning a fourth metal layer adjacent the third metal layer to form a pair of fourth metal layer islands within the bitcell height, the pair of fourth metal layer islands including a first, fourth metal layer island coupled to the first interconnect and a second, fourth metal layer island coupled to the second interconnect.

12. The method of claim 11, further comprising patterning a fifth metal layer adjacent the fourth metal layer to form a pair of strapped wordlines, including a first strapped wordline coupled to the first, fourth metal layer island, and a second strapped wordline coupled to the second, fourth metal layer island.

13. The method of claim 12, in which the pair of strapped wordlines comprises a first read wordline and a second read wordline.

14. The method of claim 12, in which the pair of strapped wordlines comprises a first write wordline and a complement write wordline.

15. The method of claim 10, in which the pair of local bitlines are coupled to a gap cell.

16. The method of claim 10, further comprising patterning a fourth metal layer in a first bitcell bank coupled to the pair of local bitlines of the bitcell in a second bitcell bank.

17. The method of claim 10, further comprising patterning a cut metal zero (CM0) line separating a first bitcell bank from a second bitcell bank.

18. The method of claim 10, in which the second metal layer is further patterned into a power rail between ground rails.

* * * * *